(12) United States Patent
Armstrong

(10) Patent No.: US 10,833,678 B1
(45) Date of Patent: Nov. 10, 2020

(54) PERFORMANCE CMOS VOLTAGE LEVEL-UP SHIFTER CIRCUIT TOPOLOGY USING PRE-DRIVE PULL-UP TRANSISTORS

(71) Applicant: HEWLETT PACKARD ENTERPRISE DEVELOPMENT LP, Houston, TX (US)

(72) Inventor: Paul Armstrong, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/525,913

(22) Filed: Jul. 30, 2019

(51) Int. Cl.
*H03K 19/0948* (2006.01)
*H03K 19/17784* (2020.01)

(52) U.S. Cl.
CPC ... *H03K 19/0948* (2013.01); *H03K 19/17784* (2013.01)

(58) Field of Classification Search
None
See application file for complete search history.

(56) References Cited

U.S. PATENT DOCUMENTS

| | | | | |
|---|---|---|---|---|
| 4,039,862 A | * | 8/1977 | Dingwall | H03K 3/356104 327/333 |
| 7,884,644 B1 | * | 2/2011 | Wu | H03K 3/017 326/68 |
| 2007/0063734 A1 | * | 3/2007 | Huang | H03K 19/00361 326/81 |

OTHER PUBLICATIONS

Gupta et al., "CMOS Voltage Level-Up Shifter—A Review", International Journal of Advances in Engineering Sciences vol. 3 (3), Jul. 2013, 4 pages.

* cited by examiner

*Primary Examiner* — Jany Richardson
(74) *Attorney, Agent, or Firm* — Hewlett Packard Enterprise Patent Department

(57) ABSTRACT

In a first example a voltage level-shifting device includes a level-shifting stage circuit. The level-shifting stage circuit includes a first level-shifting inverter circuit to invert a buffered input signal to drive a first internal node, a second level-shifting inverter circuit to invert a buffered inverted input signal to drive a second internal node, a first pre-drive circuit that receives the buffered inverted input signal, and drives the second internal node based on the state of the buffered inverted input signal, and a second pre-drive circuit that receives the buffered input signal, and drives the first internal node based on the state of the buffered input signal.

13 Claims, 6 Drawing Sheets

US 10,833,678 B1

PERFORMANCE CMOS VOLTAGE LEVEL-UP SHIFTER CIRCUIT TOPOLOGY USING PRE-DRIVE PULL-UP TRANSISTORS

This invention was made with Government support under Prime Contract No. DE-AC52-07NA27344 awarded by DOE. The Government has certain rights in this invention.

BACKGROUND

Generally, the energy consumption of a Complementary Metal-Oxide-Semiconductor ("CMOS") or other type of electronic circuit is a function of the power supply voltage. That is, a higher power supply voltage will likely result in a higher energy consumption for a particular electronic circuit. Accordingly, the power consumption of an electronic circuit can be reduced when lower power supply levels are used. While power supply voltages of about 1.0 Volts for CMOS logic circuits are presently in use, higher-voltage CMOS logic (e.g., 3.3 Volts) is still commonly used. When a low voltage CMOS circuit is used to drive a high voltage CMOS circuit, various issues arise. To address this issue, level-shifting technologies can be applied.

BRIEF DESCRIPTION OF THE DRAWINGS

The invention may be understood by reference to the following description taken in conjunction with the accompanying drawings, in which like reference numerals identify like elements, and in which.

Figure 1:
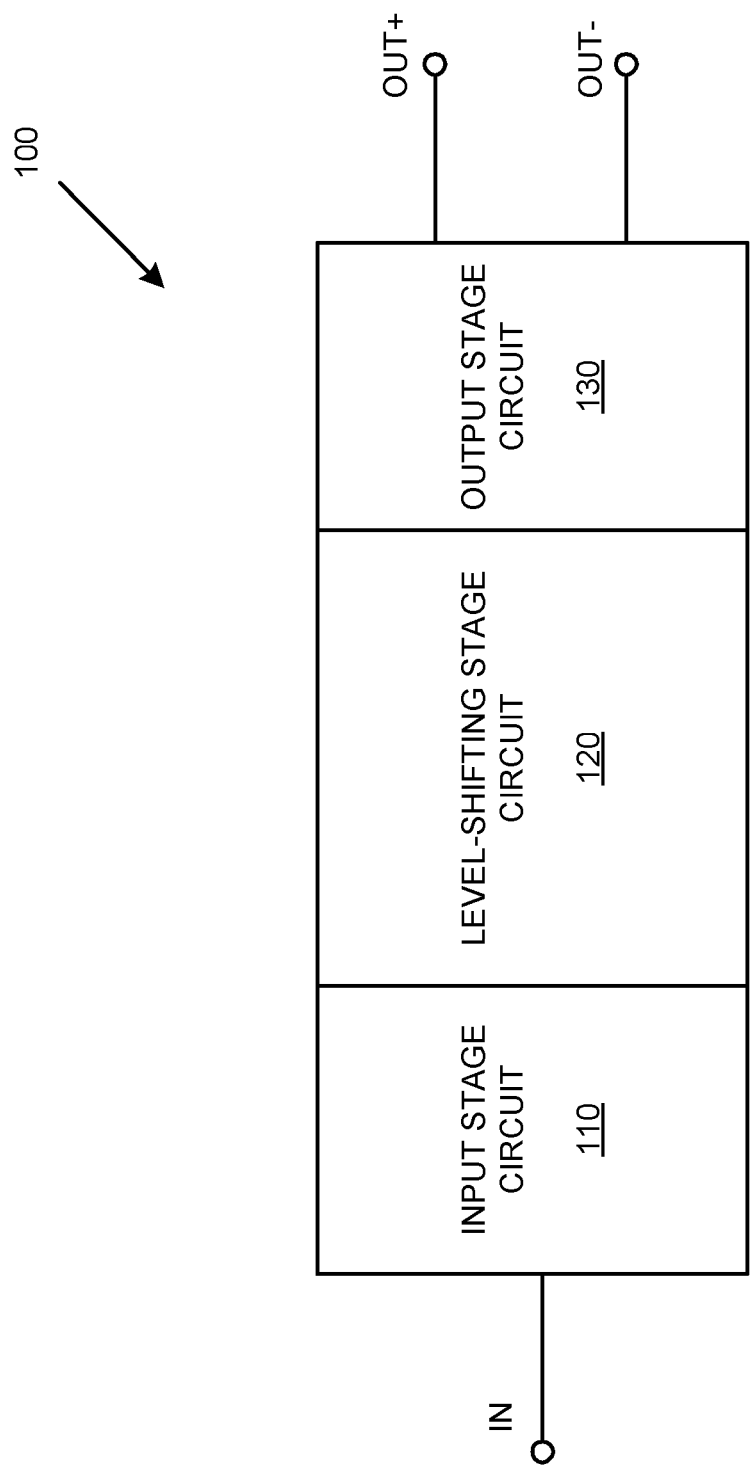
FIG. 1 depicts a block diagram of an example level-shifting buffer circuit in accordance with one or more examples of the present disclosure.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The methods and systems disclosed below may be described generally, as well as described in terms of specific examples. For instances where references are made to detailed examples, it is noted that any of the underlying principles described are not to be limited to a single example but may be expanded for use with any of the other methods and systems described herein as will be understood by one of ordinary skill in the art unless otherwise specifically stated.

The term "Metal-Oxide-Semiconductor Field-Effect Transistor" ("MOSFET", "MOS-FET," or "MOS FET") refers to a type of Field-Effect Transistor ("FET") whereby the conductivity of a doped semiconductor region is changed by the application or removal of an electric field. This ability of the doped semiconductor region to change conductivity allows for the amplification of electronic signals in various linear, switching, and/or digital applications. Generally, MOSFET devices may be divided into two categories: N-type Metal-Oxide-Semiconductor ("NMOS") transistors, which use additional valence-shell electrons as charge carriers to conduct an electric current, and P-type Metal-Oxide-Semiconductor ("PMOS") transistors, which use "holes" (vacancies in a valence-band electron population) as charge carriers. Since MOSFETs can be made with either p-type or n-type semiconductors, complementary pairs of MOS transistors can be used to make digital switching circuits with very low power consumption in the form of Complementary Metal-Oxide-Semiconductor ("CMOS") circuitry. Generally, CMOS circuits use enhancement mode MOSFETs whereby a zero gate-to-source voltage causes the transistor to be in an off state.

One advantage of CMOS technology is low power consumption as compared to other form digital logic, such as Transistor-Transistor Logic ("TTL"). This is because one transistor of the series combination of an NMOS and PMOS transistor pair is always off while the other is on, which causes the series combination to draw appreciable power only during the switching of logic states. Accordingly, CMOS circuits lend themselves to high levels of integration given the relative low power dissipation and waste heat.

Another advantage to CMOS logic is that CMOS circuits are capable of producing output voltages that swing from the CMOS circuit's ground voltage to the CMOS circuit's power supply voltage, which gives CMOS relatively high immunity to noise. However, when a first CMOS circuit using a first supply voltage sends a logical signal representing a "0" or a "1" to a second CMOS circuit using a second, higher power supply voltage, a level-shifting circuit is often inserted between the first circuit and the second circuit to assure signal compatibility. Unfortunately, these level-shifting circuits have an innate delay that can lower system performance.

Accordingly, the disclosed approach describes a level-shifter circuit that reduces delay while creating more uniform delays between rising and falling edges of complementary outputs. While not limited to any particular application, the disclosed level-shifting devices are particularly useful for high speed signals traveling from a lower "core" voltage, to a higher "input/output" voltage domain in large-scale integrated circuits. One particular innovation disclosed in the present application is the addition of pre-drive FETs that pull up on cross-coupled nodes one gate delay earlier than in other level-shifting circuits. However, to prevent these pre-drive FETs from creating drive fights on cross-coupled nodes, feedback FETs are added to shut off the pre-drive FETs after the voltage on the cross coupled nodes rises above a threshold voltage. Still further, additional FETs may be added to reduce the amount of power consumed due to shunting current that occurs when cross-coupled nodes transition between logic states.

The disclosed devices provide more balanced falling and rising edge delays, and are overall faster by about one gate delay (~10-30 ps using the Taiwan Semiconductor Manufacturing Company ("TSMC") 16 nm process). While the disclosed devices increase transistor count, the overall increase in transistor count in large-scale integrated circuits is almost negligible given the paucity of level-shifting circuits as compared to other types of circuits.

In one example embodiment, a voltage level-shifting device includes a level-shifting stage circuit. The level-shifting stage circuit includes a first level-shifting inverter circuit to invert a buffered input signal to drive a first internal node, a second level-shifting inverter circuit to invert a buffered inverted input signal to drive a second internal node, the buffered inverted input signal having a logically opposite state of the buffered input signal, a first pre-drive circuit that receives the buffered inverted input signal, and drives the second internal node based on a state of the buffered inverted input signal, and a second pre-drive circuit that receives the buffered input signal, and drives the first internal node based on a state of the buffered input signal.

In another example embodiment, a voltage level-shifting device includes a Complementary Metal-Oxide-Semiconductor ("CMOS") input stage circuit to produce a buffered input signal and a buffered inverted input signal based on a received input signal, the buffered inverted input signal having a logically opposite state of the buffered input signal. The voltage level-shifting device also includes a level-shifting stage circuit having a first level-shifting inverter circuit to invert the buffered input signal to drive a first internal node, a second level-shifting inverter circuit to invert the buffered inverted input signal to drive a second internal node, a first pre-drive circuit that receives the buffered inverted input signal, and drives the second internal node based on a state of the buffered inverted input signal, and a second pre-drive circuit that receives the buffered input signal, and drives the first internal node based on a state of the buffered input signal.

In yet another example embodiment, a voltage level-shifting device includes an input stage circuit to produce a buffered input signal and a buffered inverted input signal based on a received input signal, the buffered inverted input signal having a logically opposite state of the buffered input signal. The voltage level-shifting device also includes a level-shifting stage circuit having a first level-shifting inverter circuit to invert the buffered input signal to drive a first internal node, a second level-shifting inverter circuit to invert the buffered inverted input signal to drive a second internal node, a first pre-drive circuit that receives the buffered inverted input signal, and drives the second internal node based on a state of the buffered inverted input signal, and a second pre-drive circuit that receives the buffered input signal and drives the first internal node based on a state of the buffered input signal. The voltage level-shifting device still further includes an output buffer stage circuit to buffer a first internal signal at the first internal node to produce a first buffered output signal and to buffer a second internal signal at the second internal node to produce a second buffered output signal.

Turning to the drawings, FIG. 1 depicts a block diagram of an example level-shifting buffer circuit 100 in accordance with one or more examples of the present disclosure. In the example of FIG. 1, the level-shifting buffer circuit 100 is a step-up buffer that translates "0" and "1" logic levels for a first CMOS circuit that uses a first, lower power supply voltage to logic levels to a second CMOS circuit that uses a higher power supply voltage. As shown in FIG. 1, the example level-shifting buffer circuit 100 includes an input stage circuit 110, a level-shifting stage circuit 120, and an output stage circuit 130.

In operation, the example level-shifting buffer circuit 100 can receive an electronic/electrical input signal V_IN at the "IN" node shown at the left of the example level-shifting buffer circuit 100. One purpose of the input stage circuit 110 includes providing a buffer so as to assure that any driving circuit (not shown) that provides the input signal V_IN is not overwhelmed by any electrical demand that might cause a distortion of the input signal V_IN. In the example of FIG. 1, the voltage levels of the input voltage are 0.0 volts for a logic "0," and 0.8 volts for a logic "1." These input voltage levels are based on an assumption that the input voltage is derived from CMOS circuitry that uses a 0.8 volt power supply voltage and the CMOS circuitry is capable of outputting signals that swing from ground to the 0.8 volt power supply voltage.

Using the received input signal V_IN, the example level-shifting buffer circuit 100 can translate voltage levels using the level-shifting stage circuit 120 according to a second voltage range spanning from 0.0 volts to 1.2 volts at the OUT+ and OUT− nodes located at the right of the example level-shifting buffer circuit 100. The output voltage levels are based on an assumption that the example level-shifting buffer circuit 100 uses a 1.2 volt supply voltage, and that the intended destination for the output signals (V_OUT+ and V_OUT−) produced at the OUT+ and OUT− nodes are presumably compatible with such voltage levels. Finally, the output stage circuit 130 may be used to buffer the internal signals produced by the level-shifting stage circuit 120 to produce the above-mentioned output signals V_OUT+ and V_OUT− with sufficient current to drive an intended load. Other examples may operate on different values than those listed herein.

Figure 2:
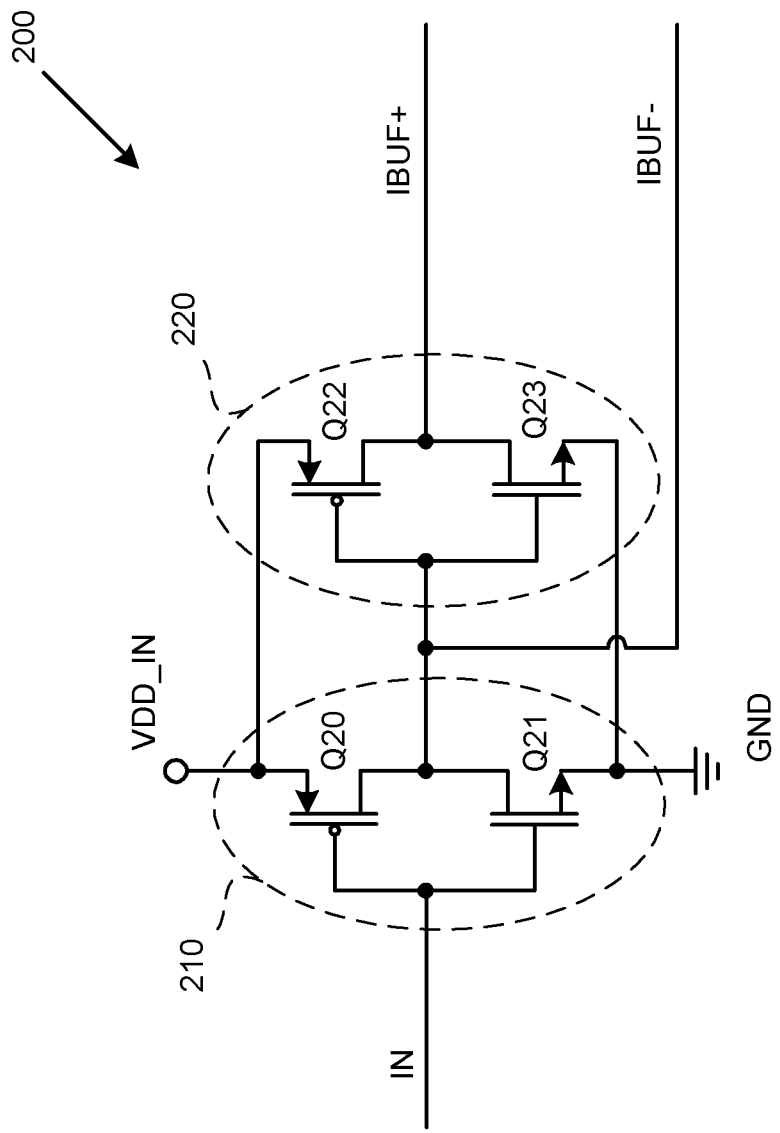
FIG. 2 depicts an example input stage circuit of a level-shifting buffer circuit in accordance with one or more examples of the present disclosure.

FIG. 2 depicts an example input stage circuit 200 of a level-shifting buffer circuit in accordance with one or more examples of the present disclosure. As shown in FIG. 2, the example input stage circuit 200 includes two pairs of CMOS inverters 210 and 220 with the first inverter 210 comprised of PMOS transistor Q20 and NMOS transistor Q21, and the second inverter 220 comprised of PMOS transistor Q22 and NMOS transistor Q23. As is also seen in FIG. 2: (1) the respective sources of PMOS transistors Q20 and Q22 are electrically connected to a first supply voltage VDD_IN, (2) the respective sources of NMOS transistors Q21 and 23 are electrically connected to electrical ground ("GND"), (3) the gate of transistor Q20 is electrically connected to the gate of transistor Q21 and to input node IN, (4) the gate of transistor Q22 is electrically connected to the gate of transistor Q23, (5) the drain of transistor Q20 is electrically connected to the drain of transistor Q21 and to the gates of transistors Q22 and Q23, and (6) the drain of transistor Q22 is electrically connected to the drain of transistor Q23.

It is to be appreciated that the first power supply voltage VDD_IN is set to 0.8 volts merely as an example, and that the range of the first supply voltage VDD_IN may be set to any positive voltage. It is also to be appreciated that each PMOS FET and each NMOS FET has a source, a drain, and a gate according to the general naming conventions known in the relevant industries. However, it is further to be appreciated that the source and the drain of a MOS transistor are generally interchangeable. Accordingly, for the purpose of broadly claiming the disclosed devices, the source and drain of a transistor may each be referred to as "power nodes," and the gate of a transistor may be referred to as a "control node" that controls the conductivity of a channel between the respective power nodes.

In operation, a binary input signal V_IN at electrical node IN is received and supplied to the gates of transistors Q20 and Q21 of the first inverter 210. In response, transistors Q20 and Q21 together invert the received binary input signal V_IN to produce a buffered inverted input signal V_IBUF− at node IBUF−. The buffered inverted input signal IBUF−, in turn, is supplied to transistors Q22 and Q23 of the second inverter 220, which together act to invert the buffered inverted input signal IBUF− to produce a buffered input signal V_IBUF+ at node IBUF+. Both the buffered input signal V_IBUF+ and the buffered inverted input signal V_IBUF− are then supplied to some form of level-shifting circuitry, such as the level-shifting circuitry discussed below.

Figure 3:
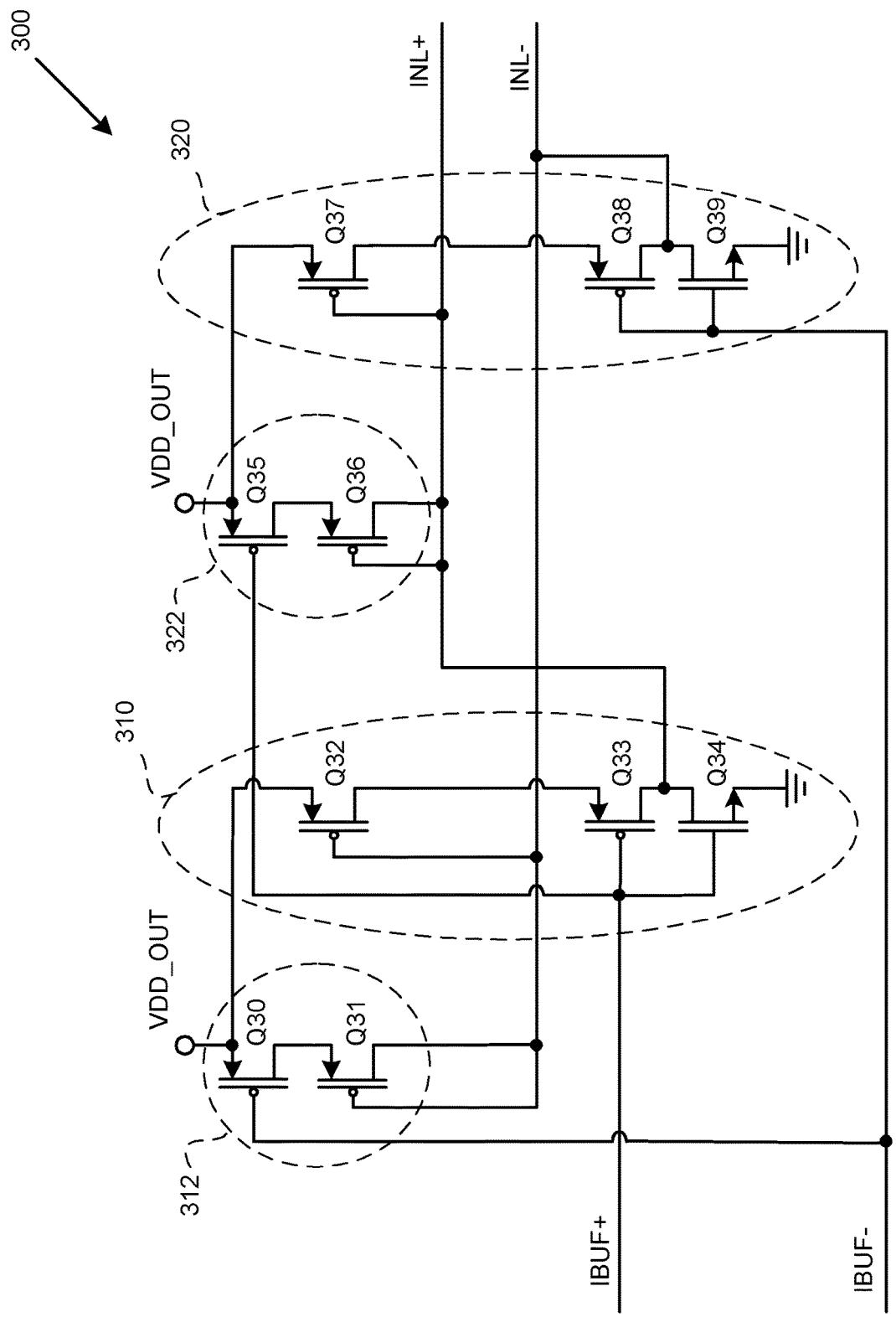
FIG. 3 depicts an example level-shifting stage circuit of a level-shifting buffer circuit in accordance with one or more examples of the present disclosure.

FIG. 3 depicts an example level-shifting stage circuit 300 of a level-shifting buffer circuit in accordance with one or more examples of the present disclosure. As shown in FIG. 3, the example level-shifting stage circuit 300 includes a first level-shifting inverter 310 comprising transistors Q32, Q33, and Q34, a second level-shifting inverter 320 comprising transistors Q37, Q38, and Q39, a first pre-drive circuit 312 comprising transistors Q30 and Q31, and a second pre-drive circuit 322 comprising transistors Q35 and Q36. As with the transistors of FIG. 2, the source and drain of any transistor in FIG. 3 may each be referred to as "power nodes," and the gate of any transistor may be referred to as a "control node" that controls the conductivity of a channel between the respective power nodes. Transistors Q30 and Q35 are the above-mentioned pre-drive pull-up transistors, and transistors Q31 and Q36 provide the above-mentioned feedback shutoff.

As is also shown in FIG. 3, the buffered input node IBUF+ is electrically connected to the gates of transistors Q33, Q34, and Q35 while the buffered inverted input node IBUF− is electrically connected to the gates of transistors Q30, Q38, and Q39. Further, the respective sources of transistors Q30, Q31, Q32, Q35, Q36, and Q37 are connected to a second power supply voltage VDD_OUT, and the respective sources to transistors Q34 and Q39 are connected to electrical ground GND. Still further, the drains of transistors Q33 and Q34 are electrically connected to produce internal signal V_INL+ at first internal node INL+, which is also electrically connected to the gate of transistor Q38, the drain of transistor Q38, and the gate of transistor Q37. Similarly, the drains of transistors Q38 and Q39 are electrically connected to produce an inverted internal signal V_INL− at second internal node INL−, which is also electrically connected to the gate of transistor Q31, the drain of transistor Q31, and the gate of transistor Q32. Finally, the drain of transistor Q32 is electrically connected to the source of transistor Q33, and the drain of transistor Q37 is electrically connected to the source of transistor Q38. The second power supply voltage VDD_OUT is set to 1.2 volts merely as a non-limiting example so long as the second supply voltage VDD_OUT is set to any positive voltage above the voltage set for VD_IN. The buffered input signal V_IBUF+ signal is provided to the gates of transistors Q33 and Q34 effectively inverting the buffered input signal V_IBUF+ to produce the internal signal V_INL+ at first internal node INL+ while the buffered inverted input signal V_IBUF− signal is provided to the gates of transistors Q38 and Q39 effectively inverting the buffered inverted input signal V_IBUF− to produce the inverted internal signal V_INL− at second internal node INL−.

According to a first operation where the buffered input signal V_IBUF+ signal transitions from a logical "0" to a logical "1," transistors Q33 and Q35 turn off while transistor Q34 turns on, which causes the internal node V_INL+ to transition from a logic "1" to a logic "0". Because the buffered inverted input signal V_IBUF− signal is a logical opposite of the buffered input signal V_IBUF+ signal, the buffered inverted input signal V_IBUF− signal transitions from a logic "1" to a logic "0." This 1-to-0 transition causes transistors Q30 and Q38 to turn on, and transistor Q39 to turn off, which causes the internal node V_INL− signal to transition from a logic "0" to a logic "1." Because transistor Q30 turns on in response to the (now low) buffered inverted input signal V_IBUF− signal, the voltage level of the second, inverted internal signal V_INL− rises faster due to current supplied through transistor Q30. In contrast, because transistor Q35 turns off in response to the (now high) buffered input signal V_IBUF+ signal, the inverted internal signal V_INL+ can transition to a low level unimpeded by transistor Q35.

Continuing, as the first internal signal V_INL+ transitions to a low level, transistors Q36 and Q37 turn on. Given that transistor Q35 is turned off before transistor Q36 turns on (due to the delay caused by transistors Q33 and Q34), no current passes through transistor Q36 so as to affect the first internal node INL+. Thus, transistor Q36 prevents drive conflicts.

In contrast, because transistor Q38 is on while transistor Q37 turns on, current passes through transistors Q37 and Q38 so as to cause the second internal signal V_INL− to rise. In addition, because transistor Q30 is recently turned on, a second current pathway is created from the second power supply VDD_OUT to the second internal node INL− through transistors Q30 and Q31 so as to causing the second internal signal V_INL− to rise faster. However, the current supplied through transistor Q30 is limited in time duration as transistor Q31 will turn off as the second internal signal V_INL− rises above a threshold. Thus, as with transistor Q36, transistor Q31 acts as a feedback shutoff so as to prevent drive conflicts.

According to a second operation where the buffered input signal V_IBUF+ signal transitions from a logical"1" to a logical "0," transistors Q33 and Q35 turn on while transistor Q34 turns off. Because the buffered inverted input signal V_IBUF− signal is a logical opposite of the buffered input signal V_IBUF+ signal, the buffered inverted input signal V_IBUF− signal transitions from a logic "0" to a logic "1." This 1-to-0 transition causes transistors Q30 and Q38 to turn off, and transistor Q39 to turn on, which causes the V_INL− signal to transition from a logic "1" to a logic "0." Because transistor Q30 turns off in response to the (now high) buffered inverted input signal V_IBUF− signal, the voltage level of the second, inverted internal signal V_INL− can transition to a low level unimpeded by transistor Q30. In contrast, because transistor Q35 turns on in response to the (now low) buffered input signal V_IBUF+, the internal signal V_INL+ rises faster due to the current supplied through transistor Q35.

Continuing, as the second internal signal V_INL− transitions to a low level, transistors Q31 and Q32 turn on. Given that transistor Q30 is turned off before transistor Q31 turns on (due to the delay caused by transistors Q38 and Q39), no current passes through transistor Q31 so as to affect the first internal node INL−. In this fashion transistor Q31 prevents drive conflicts.

In contrast, because transistor Q33 is turned on while transistor Q32 turns on, current passes through transistors Q32 and Q33 so as to cause the first internal signal V_INL+ at the first internal node INL+ to rise. In addition, because transistor Q35 is recently turned on, a second current pathway is created from the second power supply VDD_OUT to the first internal node INL+ via transistors Q35 and Q36 so as to cause the first internal signal V_INL+ to rise faster. However, the current supplied through transistor Q35 is purposely limited in time duration as transistor Q36 will turn off as the first internal signal V_INL+ rises above a threshold again preventing later drive conflicts.

Figure 4:
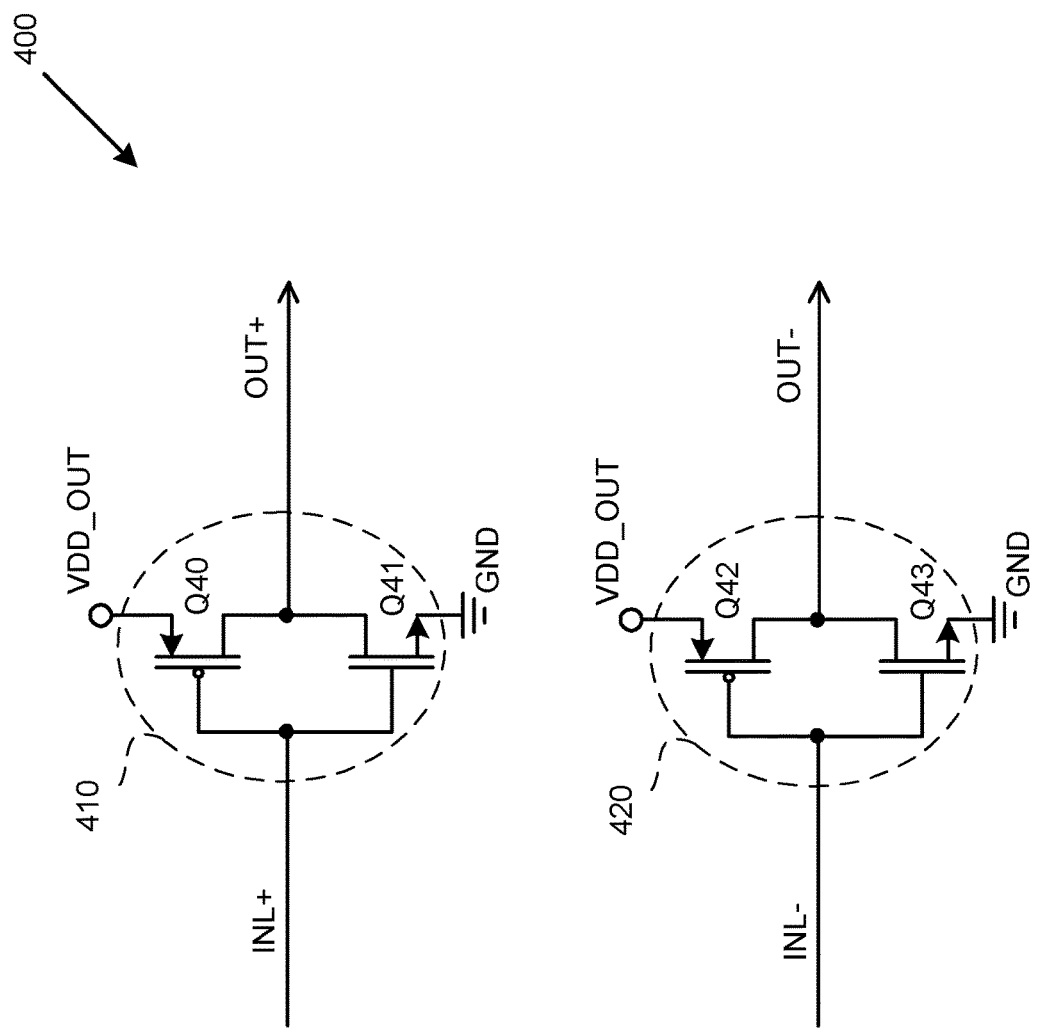
FIG. 4 depicts an example output stage circuit of a level-shifting buffer circuit in accordance with one or more examples of the present disclosure.

FIG. 4 depicts an example output stage circuit 400 of a level-shifting buffer circuit in accordance with one or more examples of the present disclosure. As shown in FIG. 4, the example output stage circuit 400 includes a first inverter that includes transistors Q40 and Q41 as well as a second inverter that includes transistors Q42 and Q43. As is also seen in FIG. 4, the respective sources of PMOS transistors Q40 and Q42 are electrically connected to the aforementioned second (higher) supply voltage VDD_OUT, the respective sources of NMOS transistors Q41 and Q43 are electrically connected to electrical ground GND, the gate of transistor Q40 is electrically connected to the gate of transistor Q4 and to node INL+ supplying the internal signal V_INL+, the gate of transistor Q42 is electrically connected to the gate of transistor Q43 and to node INL− supplying the inverted internal signal V_INL−, the drain of transistor Q40 is electrically connected to the drain of transistor Q41 and to a first output node OUT+, and the drain of transistor Q32 is electrically connected to the drain of transistor Q43 and to a second output node OUT−. As with the transistors of FIGS. 2 and 3, the source and drain of any transistor in FIG. 4 may each be referred to as "power nodes," and the gate of any transistor may be referred to as a "control node" that controls the conductivity of a channel between the respective power nodes.

In operation, the internal signal V_INL+ at the first internal node INL+ is received and supplied to the gates of transistors Q40 and Q41, and the inverted second internal signal V_INL− and the second internal node INL− is received and supplied to the gates of transistors Q42 and Q43. In response, transistors Q40 and Q41 together invert the internal signal V_INL+ to produce a first output signal V_OUT+ at first output node OUT+. Similarly, transistors Q42 and Q43 together invert the inverted internal signal V_INL− to produce a second, inverted output signal V_OUT+ at second output node OUT−.

Figure 5:
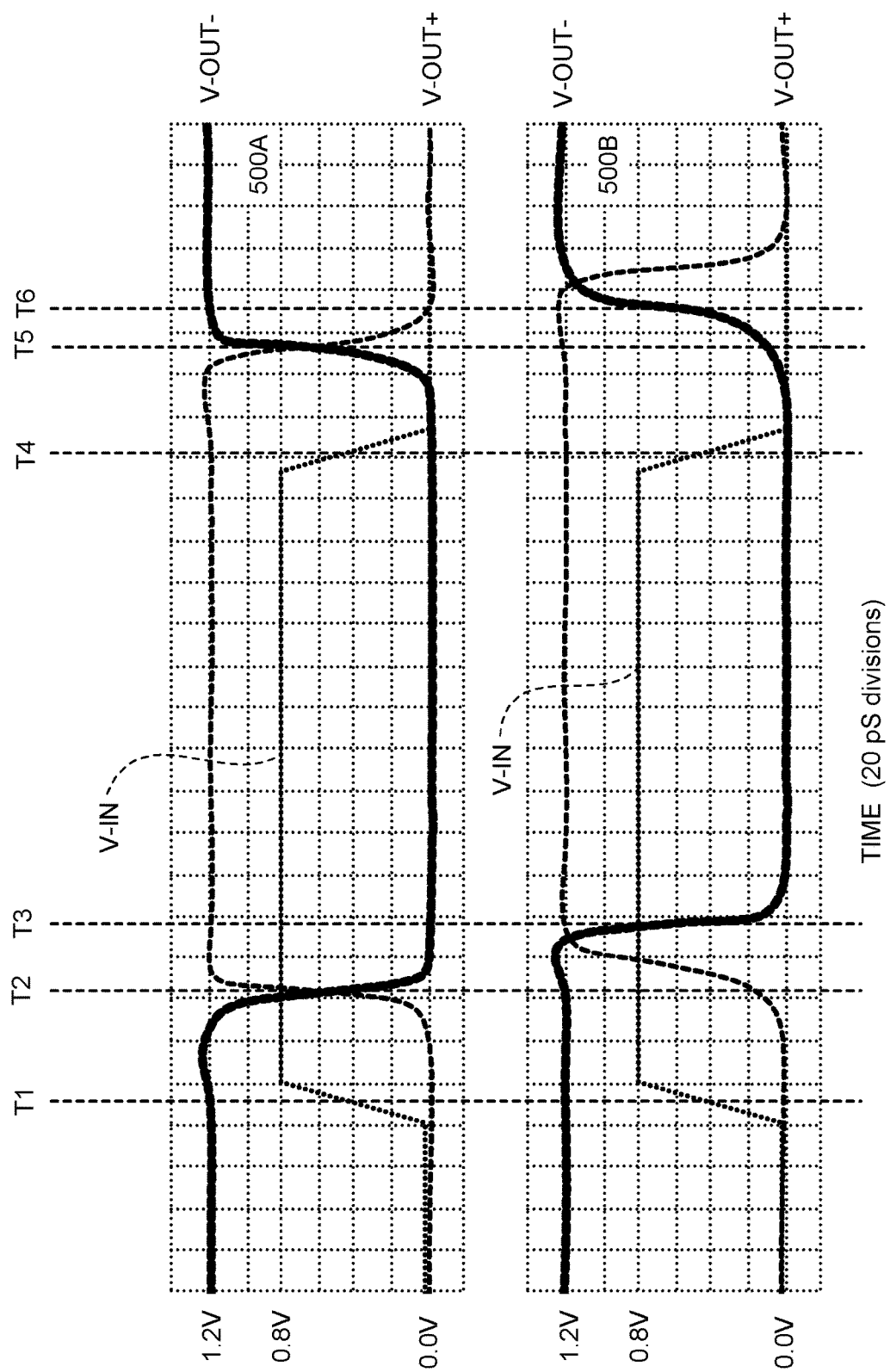
FIG. 5 depicts a timing improvement for a first output signal of the disclosed circuits in accordance with the present disclosure.

FIG. 5 depicts a timing improvement for a first output signal V_OUT− of the disclosed circuits in accordance with the present disclosure. The top timeline 510 represents the relationship of the above-discussed second (negative) level-shifted output signal V_OUT− for a 1.2V CMOS system in response to a 0.8 volt CMOS input signal V_IN for an improved level-shifting circuit consistent with FIGS. 1-4 of the present disclosure. The bottom timeline 520 represents the relationship of an alternative inverted level-shifted output signal V_OUT− for a level-shifting circuit without the pre-drive circuits 312 and 322 of FIG. 3. As shown in FIG. 5, the input signal rises at time T1 and falls at time T4 causing the alternative inverted level-shifted output signal V_OUT− to change states at times T3 and T6 respectively. In contrast, the input signal V_IN causes the inverted level-shifted output signal V_OUT− for the improved level shifting circuit to change states at times T2 and T5 respectively representing an improvement of about 38 pS (T2-T3) and 11 pS (T5-T6) respectively.

Figure 6:
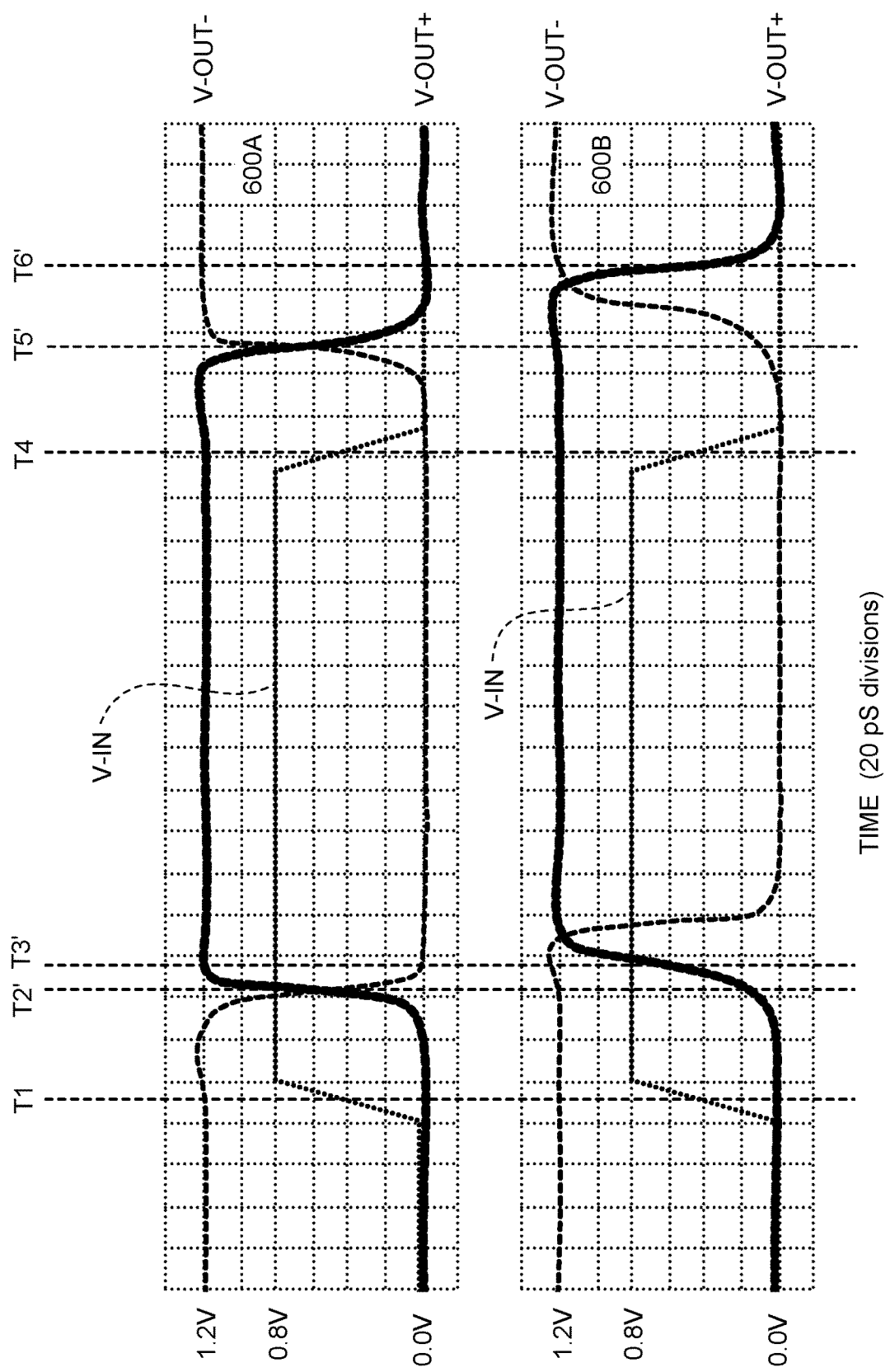
FIG. 6 depicts a timing improvement for a second output signal of the disclosed circuits in accordance with the present disclosure.

FIG. 6 depicts a timing improvement for the above-discussed first output signal V_OUT+ of the disclosed circuits in accordance with the present disclosure. Similar to FIG. 5, the top timeline 610 represents the relationship of a first (positive) level-shifted output signal V_OUT+ for a 1.2V CMOS system in response to a 0.8 volt CMOS input signal V_IN for an improved level-shifting circuit consistent with FIGS. 1-4 of the present disclosure. Also similar to FIG. 5, the bottom timeline 620 represents the relationship of an alternative level-shifted output signal V_OUT+ for a level-shifting circuit without the pre-drive circuits 312 and 322 of FIG. 3. As shown in FIG. 6, the input signal V_IN rises at time T1 and falls at time T4 causing the alternative inverted level-shifted output signal V_OUT+ to change states at times T3' and T6' respectively. In contrast, the input signal V_IN causes the first level-shifted output signal V_OUT+ for the improved level shifting circuit to change states at times T2' and T5' respectively representing an improvement of about 11 pS (T2'-T3') and 38 pS (T5'-T6') respectively. According to FIGS. 5 and 6 two advantages are realized. The first advantage is an appreciable improvement in both rise times and fall times of output signals. The second improvement is that the two output signals V_OUT+ and V_OUT− transition at the same times, i.e., T2≈T2' and T5≈T5', which may be critical for high-speed CMOS circuits requiring precisely timed complementary input signals.

While the methods and systems above are described in conjunction with specific examples, it is evident that many alternatives, modifications, and variations will be apparent to those skilled in the art. Accordingly, the examples above as set forth herein are intended to be illustrative, not limiting. There are changes that may be made without departing from the scope of the present disclosure.

What is claimed is:

1. A voltage level-shifting device, comprising:
   a level-shifting stage circuit including:
      a first level-shifting inverter circuit to invert a buffered input signal to drive a first internal node;
      a second level-shifting inverter circuit to invert a buffered inverted input signal to drive a second internal node, the buffered inverted input signal having a logically opposite state of the buffered input signal;
      a first pre-drive circuit that receives the buffered inverted input signal, and drives the second internal node based on a state of the buffered inverted input signal; and
      a second pre-drive circuit that receives the buffered input signal, and drives the first internal node based on a state of the buffered input signal; and
   an input stage circuit to produce the buffered input signal and the buffered inverted input signal from a received input signal;
   wherein:
      the input stage circuit and level-shifting stage circuit use a shared power ground;
      the input stage circuit is powered by a first power supply; and
      the level-shifting stage circuit is powered by a second power supply, the second power supply having a greater voltage than the first power supply;
      the input stage circuit and level-shifting stage circuit use a shared power ground;
      the input stage circuit is powered by a first power supply;
      the level-shifting stage circuit is powered by a second power supply, the second power supply having a greater voltage than the first power supply
      the first pre-drive circuit includes a first P-type Metal-Oxide-Semiconductor ("PMOS") transistor and a second PMOS transistor;
      a first power node of the first PMOS transistor is electrically connected to the second power supply;
      a second power node of the first PMOS transistor is electrically connected to a first power node of the second PMOS transistor;

a control node of the first PMOS transistor is electrically connected to a buffered inverted input node that provides the buffered inverted input signal; and a control node and a second power node of the second PMOS transistor are electrically connected to the second internal node.

2. The voltage level-shifting device of claim 1, wherein the input stage circuit includes:
   a first inverter to produce the buffered inverted input signal based on the input signal; and
   a second inverter to produce the buffered input signal based on the buffered inverted input signal.

3. The voltage level-shifting device of claim 2, wherein:
   both the first inverter and the second inverter include a P-type Metal-Oxide-Semiconductor ("PMOS") transistor and an N-type Metal-Oxide-Semiconductor ("NMOS") transistor arranged in series to form a Complementary Metal-Oxide-Semiconductor ("CMOS") circuit.

4. The voltage level-shifting device of claim 1, wherein:
   the first level-shifting inverter circuit includes a third PMOS transistor, a fourth PMOS transistor, and a first N-type Metal-Oxide-Semiconductor ("NMOS") transistor arranged in series;
   a control node of the third PMOS transistor is electrically connected to the second internal node;
   a first power node of the third PMOS transistor is electrically connected to the second power supply;
   a second power node of the third PMOS transistor is electrically connected to a first power node of the fourth PMOS transistor;
   a control node of the fourth PMOS transistor is electrically connected to a control node of the first NMOS transistor and to a buffered input node that provides the buffered input signal; and
   a second power node of the fourth PMOS transistor is electrically connected to a first power node of the first NMOS transistor and to the first internal node.

5. The voltage level-shifting device of claim 4, wherein:
   the second pre-drive circuit includes a fifth PMOS transistor and a sixth PMOS transistor;
   a first power node of the fifth PMOS transistor is electrically connected to the second power supply;
   a second power node of the fifth PMOS transistor is electrically connected to a first power node of the sixth PMOS transistor;
   a control node of the fifth PMOS transistor is connected to the buffered input node that carries the buffered input signal; and
   a control node and a second power node of the sixth PMOS transistor are electrically connected to the first internal node.

6. The voltage level-shifting device of claim 5, wherein:
   the second level-shifting inverter circuit includes a seventh PMOS transistor, an eighth PMOS transistor, and a second NMOS transistor arranged in series;
   a control node of the seventh PMOS transistor is electrically connected to the first internal node;
   a first power node of the seventh PMOS transistor is electrically connected to the second power supply;
   a second power node of the seventh PMOS transistor is electrically connected to a first power node of the eighth PMOS transistor;
   a control node of the eighth PMOS transistor is electrically connected to a control node of the second NMOS transistor and to the buffered inverted input node carrying the buffered inverted input signal; and
   a second power node of the eighth PMOS transistor is electrically connected to a first power node of the second NMOS transistor and to the second internal node.

7. The voltage level-shifting device of claim 6, further comprising;
   an output buffer stage circuit to buffer the first internal signal to produce a first buffered output signal and to buffer the second internal signal to produce a second buffered output signal.

8. The voltage level-shifting device of claim 7, wherein:
   the output buffer stage circuit is powered by the second power supply.

9. The voltage level-shifting device of claim 8, wherein:
   the output buffer stage circuit includes a first inverter and a second inverter;
   the first inverter receives the first internal signal to produce the first buffered output signal; and
   the second inverter receives the second internal signal to produce the second buffered output signal.

10. The voltage level-shifting device of claim 9, wherein:
    both the first inverter and the second inverter include a PMOS transistor and an NMOS transistor arranged in series to form a Complementary Metal-Oxide-Semiconductor ("CMOS") circuit.

11. A voltage level-shifting device, comprising:
    a Complementary Metal-Oxide-Semiconductor ("CMOS") input stage circuit to produce a buffered input signal and a buffered inverted input signal based on a received input signal, the buffered inverted input signal having a logically opposite state of the buffered input signal; and
    a level-shifting stage circuit that includes:
        a first level-shifting inverter circuit to invert the buffered input signal to drive a first internal node;
        a second level-shifting inverter circuit to invert the buffered inverted input signal to drive a second internal node;
        a first pre-drive circuit that receives the buffered inverted input signal, and drives the second internal node based on a state of the buffered inverted input signal; and
        a second pre-drive circuit that receives the buffered input signal, and drives the first internal node based on a state of the buffered input signal;
    wherein:
        the first pre-drive circuit includes a first P-type Metal-Oxide-Semiconductor ("PMOS") transistor having a first power node connected to a power supply and a control node electrically connected to a buffered inverted input node that provides the buffered inverted input signal;
        the first PMOS transistor turns on to supply current to the second internal node in response to the buffered inverted input signal transitioning from a high state to a low state;
        the first pre-drive circuit further includes a second PMOS transistor having a first power node connected to a second node of the first PMOS transistor, and a second power node connected to the second internal node; and
        the second PMOS transistor is configured to turn off in response to the second internal node transitioning to a high state.

12. The voltage level-shifting device of claim 11, wherein:
    the second level-shifting inverter circuit includes a third PMOS transistor, a fourth PMOS transistor, and a first N-type Metal-Oxide-Semiconductor ("NMOS") transistor arranged in series; wherein a first power node of the third PMOS transistor is electrically connected to the power supply;

a power node of the fourth PMOS transistor is electrically connected to a power node of the first NMOS transistor and to the second internal node;

the fourth PMOS transistor turns on in response to the buffered inverted input node transitioning from a high state to a low state; and the first NMOS transistor turns off in response to the buffered inverted input node transitioning from a high state to a low state.

13. The voltage level-shifting device of claim 12, wherein:

the third PMOS transistor and a fourth PMOS transistor act together to reduce current flow caused in response to the buffered inverted input signal transitioning between states.

\* \* \* \* \*